May 24, 1966 A. G. ROUSSIN ETAL 3,253,240

FINE TUNING DEVICE FOR TELEVISION RECEIVER

Filed Oct. 30, 1963

INVENTORS:
ALFRED G. ROUSSIN,
ALBERT P. WEINER,

BY Donald R. Timbre
THEIR ATTORNEY.

United States Patent Office 3,253,240

Patented May 24, 1966

3,253,240

FINE TUNING DEVICE FOR TELEVISION RECEIVER

Alfred G. Roussin, Syracuse, and Albert P. Weiner, North Syracuse, N.Y., assignors to General Electric Company, a corporation of New York Filed Oct. 30, 1963, Ser. No. 320,106
7 Claims. (Cl. 334—51)

This invention relates to a fine tuning device for a television receiver and, more particularly, to a "set-and-forget" automatic fine tuning device for the channel selector of a television receiver.

In electrical apparatus which employ a local oscillator circuit, such as a television receiver, variable capacitance devices commonly are employed for tuning the local oscillator to adjust the receiver for selection of a desired frequency band or channel. Due to the high frequencies of television channels, rather critical fine tuning of the frequency of the local oscillator circuit is required each time the receiver is adjusted for reception of a given channel. The fine tuning is generally within a range of 1–3 megacycles and the amount of capacity change is usually within the range of 1–4 microfarads. Due to the criticality of the fine tuning, it is desirable that the local oscillator be finely tuned for each individual channel in an initial alignment procedure, thereby providing "set-and-forget" automatic fine tuning of the local oscillator in subsequent channel selection.

The prior art discloses a number of arrangements for mechanically varying the value of an electrical capacitance device to effect fine tuning of a local oscillator. Many such arrangements, however, are of a rather complex nature and are undesirably expensive in costs of components and construction. Further, many of the prior art devices are subject to mechanical wear, with resultant detuning of the local oscillator. In addition, the prior art arrangements frequently are not readily accessible to the user, thereby defeating the provision of a fine tuning arrangement.

It is therefore an object of this invention to provide a fine tuning device for the channel selector of a television receiver which is of greatly simplified design and employs a minimum number of components.

Another object of this invention is to provide a fine tuning device for a channel selector of a television receiver which is inherently stable in operation and which provides "set-and-forget" automatic fine tuning of the local oscillator of the receiver upon subsequent channel selection in the use of the receiver.

A further object of this invention is to provide a fine tuning device for the channel selector of a television receiver which furnishes ready access for fine tuning.

Further objects and advantages of this invention will become apparent as the following description proceeds. Features of novelty which characterize this invention will be pointed out with particularity in the claims annexed to and forming a part of this specification.

In carrying out this invention in one form thereof, the fine tuning device comprises a first capacitive element held in a fixed position and a plurality of second capacitive elements arranged to be selectively aligned with the first capacitive element. Each of the second capacitive elements corresponds to a given one of the frequency bands or channels which the receiver may be adjusted to receive. In adjusting the receiver for reception of a given channel, the corresponding one of the second capacitive elements is aligned automatically with the first capacitive element, creating an electrical capacitance therebetween which is included in the local oscillator tank circuit of the receiver. Means are provided for independently adjusting each of the second capacitive elements when aligned with the first capacitive element to vary the magnitude of the physical displacement therebetween. By adjusting the physical displacement, the value of the electrical capacitance required for fine tuning of the local oscillator for proper reception of the corresponding channel is established. Each of the second capacitive elements is adjusted independently in this manner in an initial alignment procedure whereby there is provided "set-and-forget" automatic fine tuning in subsequent channel selection.

For a better understanding of this invention, reference may be had to the following detailed description and drawings of one illustrative embodiment thereof, in which.

Figures 1, 2:
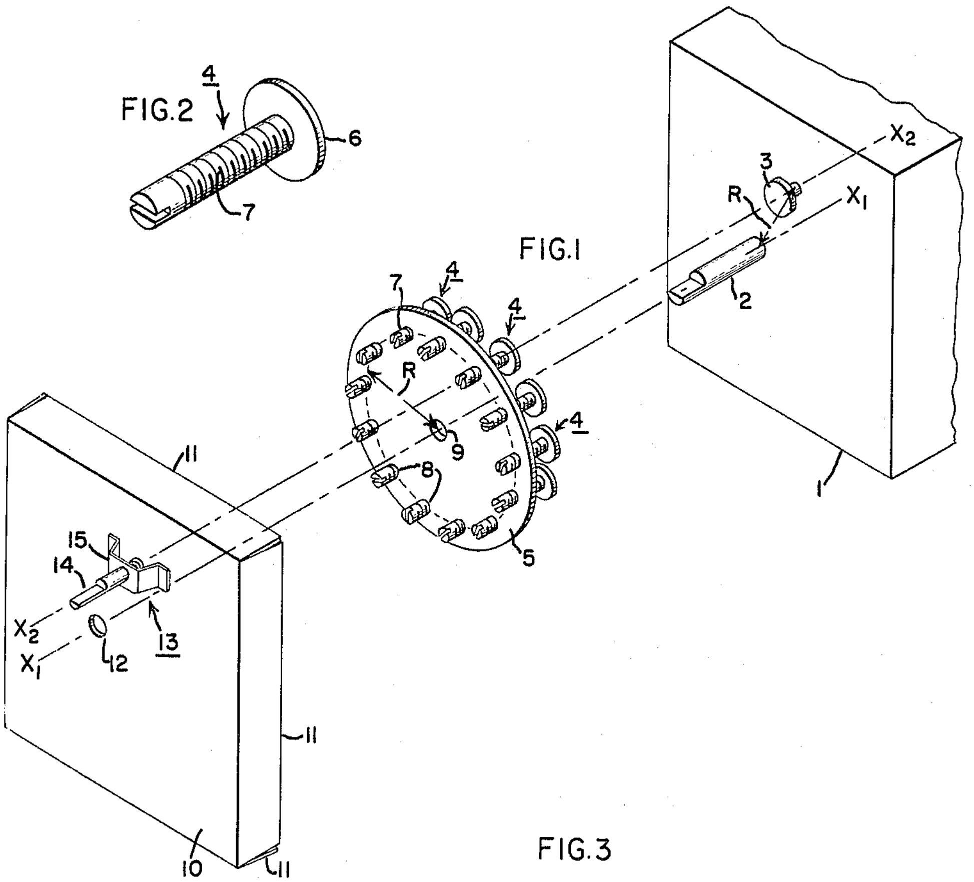
FIGURE 1 is an exploded perspective view of an embodiment of the fine tuning device of this invention.
FIGURE 2 is an enlarged perspective view of one of the capacitive elements.

In FIGURE 1, the chassis 1 of a television receiver has mounted thereon, at fixed positions, a channel selector shaft 2 and a first capacitive element 3, the axes $X_1$–$X_1$ and $X_2$–$X_2$ of the channel selector shaft 2 and the first capacitive element 3, respectively, being parallel and being separated by a predetermined distance R.

A plurality of second capacitive elements 4 are mounted on a plate 5, each of the second capacitive elements 4 comprising a disc-like portion 6 and a threaded shaft portion 7. The plate 5 is provided with a plurality of threaded apertures 8 within which the threaded shaft portions 7 of the second capacitive elements 4 are received. The plate 5 further is provided with a central aperture 9 by which the plate 5 is fixedly mounted on the channel selector shaft 2 in alignment with the axis $X_1$–$X_1$. The threaded apertures 8 are provided at displaced locations along a circle concentric with the aperture 9 and having a radius equal to the predetermined distance R. Thus, upon an appropriate rotation of the plate 5 by control shaft 2, a given one of the second capacitive elements 4 is aligned selectively with the first capacitive element 3 along the axis $X_2$–$X_2$.

A face plate 10 is provided for enclosing the above-described elements, the face plate 10 being connected to the chassis 1 by flanges 11. An aperture 12 is provided in the face plate 10 through which the channel selector shaft 2 extends. Fine tuning control 13, including control shaft 14, is mounted on face plate 10 by bracket 15, the control shaft 13 being aligned with the axis $X_2$–$X_2$.

Figure 3:
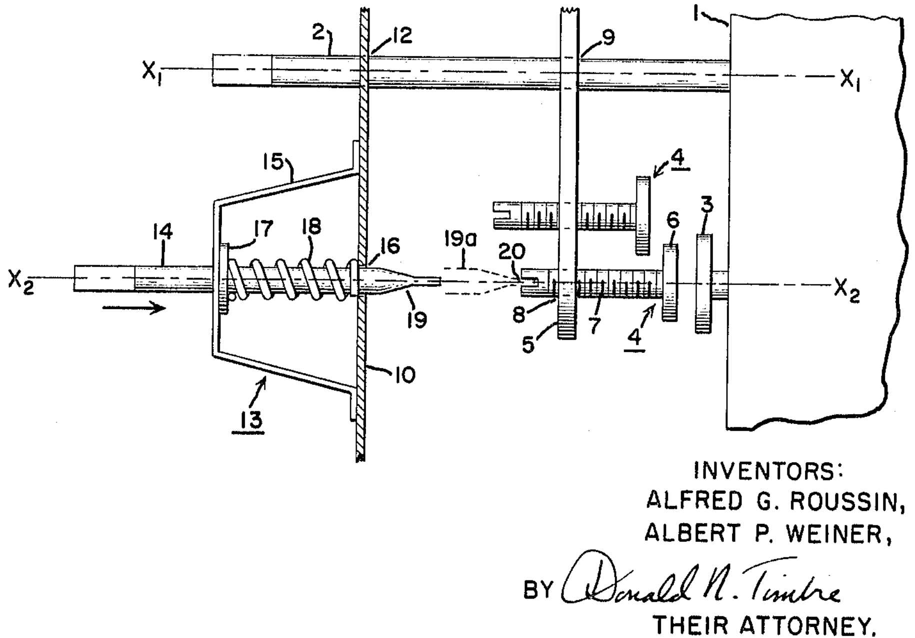
FIGURE 3 is an enlarged elevational view of a portion of the fine tuning device of this invention.

In operation, upon rotating, the channel selector shaft 2 to adjust the receiver for reception of a given channel, plate 5 is rotated therewith to automatically align the second capacitive element 4 corresponding to the given channel with the first capacitive element 3 along axis $X_2$–$X_2$. When a given second capacitive element 4 is aligned with the first capacitive element 3, as indicated in FIGURE 3, the disc-like portion 6 of the second capacitive element is parallel to, but displaced from, the first capacitive element 3, thereby creating an electrical capacitance therebetween.

In the usual design, the first capacitive element 3 is insulated from the chassis 1 and at a first electrical potential by being electrically connected to the local oscillator, not shown herein, but included with the chassis 1. The plate 5 and the channel selector shaft 2 conveniently may be formed of conductive material whereby each of the second capacitive elements 4 is electrically connected through the plate 5 and the channel selector shaft 2 to a second electrical potential, normally the ground potential of the chassis 1. The electrical capacitance created between the disc-like portion 6 of the second capacitive element and the first capacitive element 3 completes the electrical circuit of the local oscillator.

Fine tuning control 13 provides the adjustment mechanism for fine tuning of the local oscillator. As seen in FIGURE 3, the control shaft 14 extends through an aperture 16 in the face plate 10. A retaining member 17 is affixed to the control shaft 14 at a point thereon intermediate the face plate 10 and the bracket 15. Spring 18 is positioned about the control shaft 14 and extends between the face plate 10 and the retaining member 17 in a partially compressed condition to urge resiliently the retaining member 17 against the bracket 15. The spring 18 thus maintains the control shaft 14 in a normally retracted or inoperative position. To effect the fine tuning, the control shaft 14 is moved in the axial direction indicated by the arrow against the resilient urging of the spring 18, the tapered end portion 19 of the control shaft 14 engaging the slot 20 in the end of the threaded shaft portion 7 of the second capacitive element 4, as indicated by the dotted lines 19*a*. By rotating the control shaft 14 when in the engaged position, the threaded shaft portion 7 of the second capacitive element 4 is rotated within the threaded aperture 8. The rotation varies the magnitude of physical displacement of the disc-like portion 6 of the second capacitive element 4 from the first capacitive element 3 and concomitantly establishes the value of the electrical capacitance existing therebetween.

Following the adjustment of a given one of the second capacitive elements 4 to finely tune the local oscillator for reception of the corresponding channel, the control shaft 14 is released and is returned to its normally retracted position by the resilient urging of the spring 18. In sequence, the control shaft 2 is rotated selectively to adjust the receiver for reception of each of the other channels, the second capacitive elements 4 corresponding to each of the other channels automatically and successively being aligned with the first capacitive element 3 along the axis $X_2$–$X_2$. While aligned with the first capacitive element 3, each of the second capacitive elements 4 is adjusted independently by fine tuning control 13 for establishing the appropriate amount of capacitance to finely tune the local oscillator for reception of the corresponding channel. The convenient positional relationship of the channel selector shaft 2 and the fine tuning control 13 on the face plate 10 provides ease of access to the user and greatly facilitates the fine tuning operation. Prior art arrangements frequently are subject to mechanical wear in operation, causing detuning of the receiver and necessitating frequent readjustment. By contrast, the device of the invention is not subject to mechanical wear and the second capacitive elements 4 indefinitely maintain the positions to which they have been adjusted in the initial alignment procedure for providing the requisite amount of capacity to finely tune the local oscillator for reception of the corresponding channels. Thus, in subsequent channel selection, "set-and-forget" fine tuning is provided automatically and simultaneously with the rotation of the channel selector shaft 2.

The displaced locations of the second capacitive elements 4 on the plate 5 are designed to minimize any stray capacitance effects which may exist between adjacent ones of the second capacitive elements 4 and between the non-aligned second capacitance elements 4 and the first capacitive element 3. To compensate for possible axial misalignment of any given second capacitive element 4 when aligned with the first capacitive element 3, either the first capacitive element 3 may be made smaller than the disc-like portion 6 of each of the second capacitive elements 4, or, as shown in FIGURE 3, the first capacitive element 3 may be made larger than the disc-like portions 6 of each of the second capacitive elements 4.

Many salient features of the instant invention will readily be appreciated. The fine tuning device employs a minimum number of components and is very inexpensive to construct; however, the fine tuning achieved is extremely accurate. Further, the fine tuning control 13 is readily accessible to the user and is conveniently located relative to the channel selector shaft 2 in the embodiment of the invention shown and described. A particularly beneficial feature of the invention arises from the fact that, following the initial alignment procedure for tuning the local oscillator circuit for the reception of each of the desired channels or frequency bands, the physical displacement of each of the second capacitive elements 4 from the first capacitive element 3 when aligned therewith is permanently maintained, wearing effects which cause subsequent detuning, such as exist in prior art devices, not being present in the device of the invention. Thus, the initially established finely tuned values of capacitance required for tuning the receiver for reception of each of the channels or frequency bands will be maintained in a "set-and-forget" manner for an indefinite period of time and will be provided automatically in subsequent channel selection.

Although the invention has been shown and described with reference to one specific embodiment thereof, it is not intended that the invention be so limited, and many modifications and adaptations of the invention will be obvious to those skilled in the art. Thus, it is intended by the appended claims to cover all such modifications and adaptations which fall into the true spirit and scope of this invention.

What we claim as new and desire to secure by Letters Patent of the United States is:

1. In a television receiver having a local oscillator to be finely tuned automatically in correspondence with adjustment of the receiver for reception of a given one of a plurality of channels, a fine tuning device comprising:

(a) a first capacitive element, (b) a plurality of second capacitive elements, each of said second capacitive elements corresponding to a given one of the channels, (c) selector means for aligning a corresponding one of said second capacitive elements with said first capacitive element to provide an electrical capacitance therebetween when adjusting the receiver for reception of a given channel, said electrical capacitance completing the circuit of the local oscillator, (d) fine tuning control means for individually adjusting, in sequence, each of said second capacitive elements when aligned with said first capacitive element to vary the physical displacement therebetween for establishing the value of electrical capacitance required for finely tuning the local oscillator for reception of the corresponding channel, (e) whereby in operation of said selector means to adjust the receiver for selection of a given channel, the value of electrical capacitance required for fine tuning of the local oscillator is provided automatically.

2. In a television receiver having a local oscillator to be finely tuned automatically in correspondence with adjustment of the receiver for reception of a given one of a plurality of channels, a fine tuning device comprising:

(a) a first capacitive element held in a fixed position, (b) a plurality of second capacitive elements, each of said second capacitive elements corresponding to a given one of the channels, (c) a common mounting means, said plurality of said second capacitive elements being mounted on said common mounting means, (d) selector means for actuating said common mounting means for aligning a corresponding one of said second capacitive elements with said first capacitive element to provide an electrical capacitance therebetween when adjusting the receiver for reception of a given channel, said electrical capacictance completing the circuit of the local oscillator, (e) fine tuning control means for individually adjusting, in sequence, each of said second capacitive elements when aligned with said first capacitive element to vary the physical displacement therebetween for establishing the value of electrical capacitance required for finely tuning the local oscillator for reception of the corresponding channel, (f) whereby in operation of said selector means to adjust the receiver for selection of a given channel, the value of the electrical capacitance required for fine tuning of the local oscillator is provided automatically.

3. The fine tuning device recited in claim 2 wherein:

(a) said common mounting means comprises a rotatable plate having a plurality of threaded apertures therein, and (b) each of said second capacitive elements has a threaded shaft portion, and (c) said threaded shaft portions are received within said threaded apertures for mounting said second capacitive elements on said rotatable plate.

4. The fine tuning device as recited in claim 3 wherein said common mounting means comprises an electrically conductive rotatable plate.

5. In a television receiver having a local oscillator to be finely tuned automatically in correspondence with adjustment of the receiver for reception of a given one of a plurality of channels, a fine tuning device comprising:

(a) a channel selector shaft mounted at a first position on the chassis of the television receiver and rotatable for adjusting the receiver for reception of a given one of a plurality of channels, (b) a first capacitive element mounted at a second position on the chassis and at a predetermined distance from the first position, (c) a rotatable plate, said rotatable plate being provided with a central aperture for axially positioning and fixedly mounting said rotatable plate on said channel selector shaft for rotation therewith, (d) a plurality of second capacitive elements, each of said second capacitive elements corresponding to a given one of the channels, (e) means for mounting said second capacitive elements on said rotatable plate at displaced locations along a circle concentric with said aperture and having a radius equal to said predetermined distance, rotation of said channel selector shaft for adjusting the receiver for reception of a given channel concomitantly effecting a rotation of said rotatable plate for aligning a corresponding one of said second capacitive elements with said first capacitive element to provide an electrical capacitance therebetween, the electrical capacitance completing the circuit of the local oscillator, and (f) Fine tuning control means individually adjusting each of said second capacitive elements when aligned with said first capacitive element to vary the physical displacement therebetween for establishing the value of electrical capacitance required for finely tuning the local oscillator for reception of the corresponding channel, (g) whereby in rotation of said channel selector shaft to adjust the receiver for selection of a given channel, the value of electrical capacitance required for fine tuning of the local oscillator is provided automatically.

6. The fine tuning device recited in claim 5 wherein said means for mounting said second capacitive elements on said rotatable plate comprises:

(a) a threaded shaft portion on each of said second capacitive elements, and (b) a plurality of threaded apertures in said rotatable plate at said displaced locations, (c) the threaded shaft portions of said second capacitive elements being received within said threaded aperture for mounting said second capacitive elements on said rotatable plate.

7. In a television receiver having a local oscillator to be finely tuned automatically in correspondence with adjustment of the receiver for reception of a given one of a plurality of channels, a fine tuning device as recited in claim 6 wherein:

(a) each of said threaded shaft portions of said second capacitive elements includes an end portion having a slot therein the end portions extending beyond the side of the rotatable plate remote from said first capacitive element, and (b) said fine tuning control means comprises:

(b1) a control shaft having a tapered end portion, said control shaft being aligned with said first capacitive element, and (b2) a resilient member normally urging said control shaft axially to an inoperative position, (c) said control shaft being adapted for axial movement to an operative position against the urging of said resilient member for inserting said tapered end portion within the slot in the aligned second capacitive element which is aligned with the first capacitive element, and said control shaft being rotatable in said operative position for rotating the second capacitive element so aligned to vary the physical displacement thereof from the first capacitive element.

References Cited by the Examiner

UNITED STATES PATENTS

| | | | |
|---|---|---|---|
| 2,467,737 | 4/1949 | Germer | 334—80 |
| 2,981,838 | 4/1961 | Poskozim | 334—51 |
| 3,136,966 | 6/1964 | Lindeman et al. | 334—51 |

HERMAN KARL SAALBACH, *Primary Examiner.*

R. F. HUNT, *Assistant Examiner.*